(12) United States Patent
Trimberger (10) Patent No.: US 7,619,438 B1
(45) Date of Patent: Nov. 17, 2009

(54) METHODS OF ENABLING THE USE OF A DEFECTIVE PROGRAMMABLE DEVICE

(75) Inventor: Stephen M. Trimberger, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/974,354

(22) Filed: Oct. 11, 2007

(51) Int. Cl.
*H03K 19/003* (2006.01)

(52) U.S. Cl. ............. 326/10; 365/189.12; 365/200

(58) Field of Classification Search ......... 326/9, 326/38–41; 365/189.12, 200, 189.01; 714/710, 714/725; 324/528
See application file for complete search history.

(56) References Cited

U.S. PATENT DOCUMENTS

| | | |
|---|---|---|
| 4,899,067 A | 2/1990 | So et al. |
| 5,153,880 A | 10/1992 | Owen et al. |
| 5,255,227 A | 10/1993 | Haeffele |
| 5,349,248 A | 9/1994 | Goetting et al. |
| 5,430,734 A | 7/1995 | Gilson |
| 5,434,514 A | 7/1995 | Cliff et al. |
| 5,459,342 A | 10/1995 | Nogami et al. |
| 5,485,102 A | 1/1996 | Cliff et al. |
| 5,498,975 A | 3/1996 | Cliff et al. |
| 5,513,144 A | 4/1996 | O'Toole |
| 5,592,102 A | 1/1997 | Lane et al. |
| 5,689,516 A | 11/1997 | Mack et al. |
| 5,742,556 A | 4/1998 | Tavrow et al. |
| 5,761,483 A | 6/1998 | Trimberger |
| 5,764,577 A | 6/1998 | Johnston et al. |
| 5,777,887 A | 7/1998 | Marple et al. |
| 5,796,750 A | 8/1998 | Lottridge et al. |
| 5,925,920 A | 7/1999 | MacArthur et al. |
| 5,931,959 A | 8/1999 | Kwiat |
| 5,963,463 A | 10/1999 | Rondeau, II et al. |
| 5,991,215 A | 11/1999 | Brunelle |
| 5,996,096 A | 11/1999 | Dell et al. |
| 6,003,150 A | 12/1999 | Stroud et al. |
| 6,107,821 A | 8/2000 | Kelem et al. |
| 6,166,559 A | 12/2000 | McClintock et al. |
| 6,167,558 A | 12/2000 | Trimberger |
| 6,201,404 B1 | 3/2001 | Reddy et al. |
| 6,202,182 B1 | 3/2001 | Abramovici et al. |
| 6,247,147 B1 | 6/2001 | Beenstra et al. |
| 6,279,146 B1 | 8/2001 | Evans et al. |

(Continued)

OTHER PUBLICATIONS

U.S. Appl. No. 10/714,380, filed Oct. 31, 2003 by Trimberger.

(Continued)

*Primary Examiner*—Rexford N Barnie
*Assistant Examiner*—Crystal L Hammond
(74) *Attorney, Agent, or Firm*—John J. King (57) ABSTRACT

Methods of enabling the use of defective programmable devices. The method comprises performing functional testing for each programmable device of a plurality of programmable devices; identifying each programmable device of the plurality of programmable devices having a defective portion of programmable blocks; identifying, for each programmable device which is identified to have a defective portion of programmable blocks, a location of the defective portion; and storing, for each programmable device which is identified to have a defective portion of programmable blocks, the location of the defective portion on the programmable device.

20 Claims, 7 Drawing Sheets

U.S. PATENT DOCUMENTS

| | | |
|---|---|---|
| 6,289,292 B1 | 9/2001 | Charlton et al. |
| 6,292,925 B1 | 9/2001 | Dellinger et al. |
| 6,311,316 B1 | 10/2001 | Huggins et al. |
| 6,344,755 B1 | 2/2002 | Reddy et al. |
| 6,496,971 B1 | 12/2002 | Lesea et al. |
| 6,530,071 B1 | 3/2003 | Guccione et al. |
| 6,560,740 B1 | 5/2003 | Zuraski, Jr. et al. |
| 6,594,610 B1 | 7/2003 | Toutounchi et al. |
| 6,618,686 B2 | 9/2003 | Allamsetty |
| 6,664,808 B2 | 12/2003 | Ling et al. |
| 6,668,237 B1 | 12/2003 | Guccione et al. |
| 6,681,353 B1 | 1/2004 | Barrow |
| 6,704,889 B2 | 3/2004 | Veenstra et al. |
| 6,725,442 B1 | 4/2004 | Cote et al. |
| 6,744,274 B1 | 6/2004 | Arnold et al. |
| 6,779,133 B2 | 8/2004 | Whetsel |
| 6,807,631 B2 | 10/2004 | Fuller et al. |
| 6,817,006 B1 | 11/2004 | Wells et al. |
| 6,839,792 B2 | 1/2005 | Feldstein et al. |
| 6,864,710 B1 | 3/2005 | Lacey et al. |
| 6,915,503 B1 | 7/2005 | Lesea |
| 6,918,027 B2 | 7/2005 | Mantey et al. |
| 6,924,663 B2 | 8/2005 | Masui et al. |
| 6,925,407 B2 | 8/2005 | Duppong |
| 6,961,884 B1 | 11/2005 | Draper |
| 6,973,608 B1 | 12/2005 | Abramovici et al. |
| 7,007,250 B1 | 2/2006 | Bapat et al. |
| 7,045,472 B2 | 5/2006 | Cooney et al. |
| 7,047,465 B1 | 5/2006 | Trimberger |
| 7,071,679 B1 | 7/2006 | Sabih et al. |
| 7,080,300 B1 | 7/2006 | Herron et al. |
| 7,089,466 B2 | 8/2006 | Odom et al. |
| 7,127,697 B1 | 10/2006 | Wells et al. |
| 7,133,822 B1 | 11/2006 | Jacobson |
| 7,146,598 B2 | 12/2006 | Horanzy |
| 7,180,324 B2 * | 2/2007 | Chan et al. .................... 326/10 |
| 7,185,293 B1 | 2/2007 | Ofer |
| 7,185,295 B2 | 2/2007 | Park et al. |
| 7,187,198 B2 * | 3/2007 | Akimichi ..................... 326/38 |
| 7,187,597 B1 * | 3/2007 | Trimberger ............ 365/189.12 |
| 7,209,794 B2 | 4/2007 | Duppong |
| 7,216,277 B1 | 5/2007 | Ngai et al. |
| 7,219,278 B2 | 5/2007 | Avery et al. |
| 7,227,364 B1 * | 6/2007 | Fan et al. .................... 324/528 |
| 7,228,521 B1 | 6/2007 | Ma et al. |
| 7,233,532 B2 | 6/2007 | Vadi et al. |
| 7,240,218 B2 | 7/2007 | Kean |
| 7,251,804 B1 | 7/2007 | Trimberger |
| 7,269,765 B1 * | 9/2007 | Charlton et al. ............. 714/710 |
| 7,284,159 B2 | 10/2007 | Chakraborty et al. |
| 7,284,229 B1 | 10/2007 | Trimberger |
| 7,307,442 B2 | 12/2007 | Ong |
| 7,363,560 B1 * | 4/2008 | Mark et al. .................. 714/725 |
| 7,412,635 B1 * | 8/2008 | Trimberger ................. 714/725 |
| 7,424,655 B1 | 9/2008 | Trimberger |
| 2003/0212940 A1 | 11/2003 | Wong |
| 2004/0193979 A1 | 9/2004 | Avery et al. |
| 2005/0125512 A1 | 6/2005 | Fuller et al. |
| 2006/0259871 A1 | 11/2006 | Washington et al. |

OTHER PUBLICATIONS

U.S. Appl. No. 10/813,414, filed Mar. 29, 2004 by Stassart et al.
U.S. Appl. No. 11/895,132, filed Aug. 23, 2007, Trimberger.
U.S. Appl. No. 11/974,355, filed Oct. 11, 2007, Trimberger et al.
U.S. Appl. No. 11/974,387, filed Oct. 11, 2007, Trimberger.
U.S. Appl. No. 12/141,958, filed Jun. 19, 2008, Trimberger.
U.S. Appl. No. 12/141,959, filed Jun. 19, 2008, Trimberger.
U.S. Appl. No. 12/181,344, filed Jul. 29, 2008, Trimberger.
U.S. Appl. No. 12/181,346, filed Jul. 29, 2008, Trimberger.
Altera; Altera Data Sheet, vol. 1, Chapter 3 "Configuration and Testing"; and vol. 2 Chapter 8 "Remote System Upgrades with Stratix II Devices"; Feb. 2004; downloaded on Jun. 17, 2004 from http://www.altera.com/literature/lit-stx2.
Culbertson, W. Bruce et al.; "Defect Tolerance on the Teramac Custom Computer"; The 5th Annual IEEE Symposium on Field-Programmable Custom Computing Machines; Apr. 16-18, 1997; pp. 116-123.
Emmert, John et al.; "Dynamic Fault Tolerance in FPGAs via Partial Reconfiguration"; Annual IEEE Symposium on Field-Programmable Custom Computing Machines; Apr. 17, 2000; pp. 165-174.
Emmert, John M. et al.; "Incremental Routing in FPGAs"; ASIC Conference 1998. Proceedings, Eleventh Annual IEEE International; Rochester, NY; Sep. 13-16, 1998; pp. 217-221.
Hanchek, Fran et al.; "Node-Covering Based Defect and Fault Tolerance Methods for Increased Yield in FPGAs"; The Proceedings of the Ninth International Conference on VLSI Design; Jan. 1996; pp. 1-4.
Xilinx, Inc.; DS031 v1.1, "Virtex-II Pro Platform FPGA Handbook"; published Dec. 6, 2000; available from Xilinx, Inc., 2100 Logic Drive, San Jose, California 95124; pp. 33-75.

* cited by examiner

METHODS OF ENABLING THE USE OF A DEFECTIVE PROGRAMMABLE DEVICE

FIELD OF THE INVENTION

The present invention relates generally to integrated circuits, and in particular, to methods of enabling the use of a defective programmable logic device.

BACKGROUND

A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

In manufacturing and employing integrated circuits such as PLDs, it is important that they operate properly in a system. When a completed integrated circuit malfunctions after it has been installed in a system, such as a consumer electronics product, the malfunction of the integrated circuit may cause the entire product to fail. As PLDs are manufactured according to smaller dimensions, defects in some of the circuits are becoming more common. Further, the increased complexity of PLDs, such as an increased number of layers, has also increased the possibility for electrical faults. Finally, the die size of programmable logic device has also continued to increase, and therefore increased the likelihood of defects.

Integrated circuits such as PLDs are typically tested after fabrication. In order to avoid causing problems for end users, a PLD is generally discarded if it contains defects that affect the active logic. The percentage of usable integrated circuits is called the "yield" because it indicates the fraction of usable integrated circuits in a manufactured lot. The increase in PLD size and density has led to an increase in the percentage of defective die, and a corresponding decrease in product yield. A low yield has a significant economic impact on PLD providers. While die having gross defects which cause the failure of an entire PLD must be discarded, die having localized defects which cause the failure of small portions of the PLD circuitry may often be salvaged by using only the portion of the device not having defects. One known method for using partially defective PLDs is to sort out those PLDs that are defective only in an isolated function or area. The PLD provider may sell these partially defective devices to a customer at a reduced price rather than discarding them.

While such a use of defective PLDs may increase yield, there is also an associated cost of managing the defective PLDs. Because defects may be present in different locations for different devices, managing defective integrated circuits may be time consuming and expensive. Integrated circuits are commonly binned according to performance, such as operating speed, as well as for pass/fail. Defective integrated circuits may be binned according to the location of defects, for example. Accordingly, each of the bins of integrated circuits having different defects must be separately managed. Such a requirement may be costly for a producer of programmable logic devices, and increase the cost of selling the defective programmable logic devices.

Accordingly, there is a need for an improved method of enabling the use of defective programmable logic devices.

SUMMARY

Methods of enabling the use of defective programmable logic devices are disclosed. The method comprises performing functional testing of each programmable logic device of a plurality of programmable logic devices; identifying each programmable logic device of the plurality of programmable logic devices which has a defective portion of programmable logic; identifying, for each programmable logic device which is identified to have a defective portion of programmable logic, a location of the defective portion; storing, for each programmable logic device which is identified to have a defective portion of programmable logic, the location of the defective portion; and selecting a configuration bitstream for one of the programmable logic devices, wherein the selected configuration bitstream is selected from a plurality of configuration bitstreams based upon the stored location of the defective portion for the one of the programmable logic devices. The location of the defective portion can be stored on the programmable logic device (e.g., in a non-volatile memory) or in an external memory storage device. The method may further comprise dividing the programmable logic of the plurality of programmable logic devices into regions, wherein identifying the location of the defective portion of programmable logic comprises designating a region having the defective programmable logic. Storing the location of the defective portion of programmable logic may comprise storing the location in a non-volatile memory. Accordingly, it may be possible to categorize programmable logic devices having defective programmable logic in different regions in a common category of defective products according to embodiments of the present invention.

According to an alternate embodiment, a method of enabling the use of defective programmable logic devices comprises receiving a plurality of programmable logic devices, each programmable logic device having an indication of the location of a defective portion of programmable logic; selecting, for each programmable logic device, a configuration bitstream of a plurality of configuration bitstreams implementing the same circuit design, wherein the selection of a configuration bitstream is based upon the location of the defective portion of programmable logic; and programming each programmable logic device with a corresponding selected configuration bitstream of the plurality of configuration bitstreams. The method may further comprise receiving an indication for each programmable logic device of the location of the defective portion of the programmable logic. Further, selecting the configuration bitstream may comprise selecting the configuration bitstream based upon the location of the defective portion of the programmable logic being within a predetermined region of the programmable logic.

A device having programmable logic according to an embodiment of the invention may comprise a plurality of programmable logic circuits, wherein at least a portion of the programmable logic circuits is defective; a non-volatile memory storing an indication of a location of the defective portion of the programmable logic circuits; and a plurality of configuration memory elements storing configuration bits of a selected configuration bitstream, wherein the selected configuration bitstream is selected based upon the indication stored in the non-volatile memory. The device may further comprise configuration logic or a configuration controller coupled to the non-volatile memory to provide the indication of the location of the portion of the programmable logic circuits which is defective by way of an input/output block.

DETAILED DESCRIPTION OF THE DRAWINGS

Figure 1:
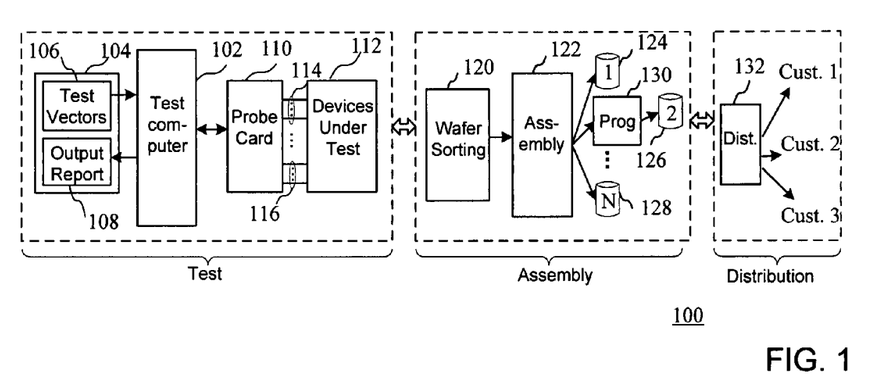
FIG. 1 is a block diagram of a system for distributing integrated circuits having programmable logic according to an embodiment of the present invention.

Turning first to FIG. 1, a block diagram of a system for distributing integrated circuits having programmable logic according to an embodiment of the present invention is shown. In particular, after dice on wafers are tested, they are assembled as packaged integrated circuits and distributed to customers. For programmable logic devices, the packaged integrated circuits may be programmed by a manufacturer or distributor, enabling a customer to assemble devices incorporating the packaged integrated circuits and to sell the devices to end users. Alternatively, the packaged integrated circuits may be provided to customers to program and assemble in a device.

As shown in FIG. 1, a test computer 102 is coupled to receive a plurality of test vectors 106 of a test program 104 and generate an output report 108 which is based upon outputs of a probe card 110 applied to the devices under test 112. Dice are tested to determine both whether the dice are defective and the performance characteristics of the dice, and defective dice are discarded. While reference is made to a probe card, the probe card 110 may comprise any device or fixture having a plurality of probes. As will be described in more detail below, the probe card 110 is coupled to devices under test 112 by a plurality of probe sites including probe sites 114 and 116 shown in FIG. 1. Although two probe sites are shown, a probe card may include many probe sites, where each probe site includes a number of probes.

A wafer sorting machine 120 enables wafers to be processed in batches. Examples of wafer sorters are generally available from Credence Systems Corporation of Milipitas, Calif. or Teradyne, Inc. of Boston, Mass., and are well known in the art of semiconductor manufacturing. After wafer sorting, the wafers are removed from the wafer sorter and moved to assembly equipment 122, where the wafers are sliced into dice for assembly. The packaging of dice which are not determined to be defective is performed during the assembly process. The assembled integrated circuits are then sorted according to any criteria, such as speed, to bins 124-128, for example. However, according to one aspect of the present invention, integrated circuits having defective programmable logic are binned in a separate bin, and more particularly, in a common bin 126. That is, integrated circuits having defective programmable logic may be binned in a common bin regardless of the location of the defective programmable logic.

According to a further aspect of the invention, the location of the defective programmable logic is recorded for each integrated circuit. For example, each defective integrated circuit can be separately programmed to indicate the location of the defective programmable logic. Alternatively or additionally, a record in a computer database external to the defective programmable logic device can be created to indicate the location of a defect in a programmable logic device based upon an identifier associated with the device which is readable on the device, such as a bar code, a serial number, electronically-stored device serial number, or some other unique identifier for the device. That is, rather than (or in addition to) storing an indication in a memory of the device, the location of the defect can be stored on the device by physically marking the device itself with some identifier indicating the location of a defective portion of programmable logic.

Assembled packaged integrated circuits are shipped during a distribution process, where a distribution channel 132 enables integrated circuits to be shipped to customers. During the distribution process, the integrated circuits may further be programmed with one of a plurality of configuration bitstreams for a single user specific design which avoids the defective portion(s) of the programmable logic, or without the user specific design, enabling them to instead be programmed by customers as will be described in more detail below.

Figure 2:
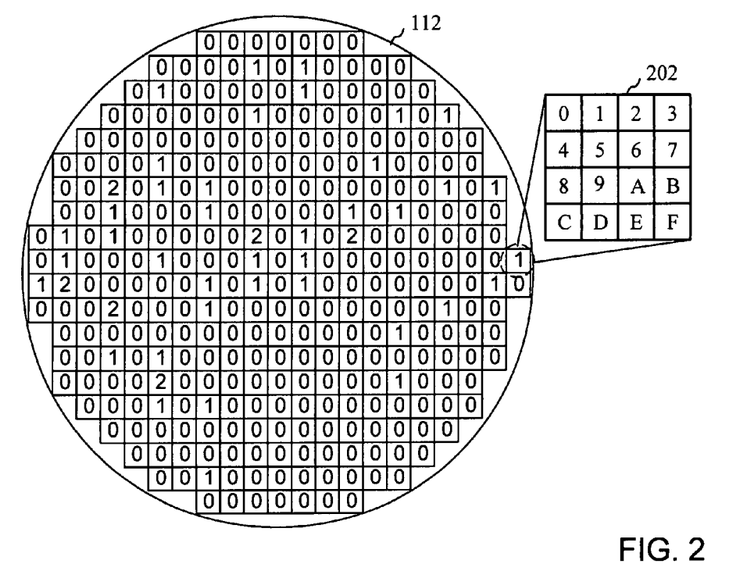
FIG. 2 is a top plan view of a wafer having a plurality of dice including defective dice according to an embodiment of the present invention.

Turning now to FIG. 2, a top plan view shows a wafer having a plurality of dice including defective dice according to an embodiment of the present invention. In particular, a device under test 112 comprises a wafer having various dice which are designated with a number indicating the defect status of the device. For example, a designation of "0" may indicate that the device has no defects in the programmable logic, a designation of "1" may indicate that a portion of the programmable logic is defective, and a designation of "2" may indicate that the die has gross defects.

An expanded view of a die of the wafer shows a device 202 having defects in programmable logic. In particular, the die is divided into a plurality of regions. In the example of FIG. 2, the die is divided into 16 regions 0-F, where the shaded region 9 contains defective programmable logic. The location of the defective region may be identified, for example, according to the physical location of the defects on the die.

The regions need not be the same size or evenly distributed on the die, and the method used to identify defective regions of a device may depend on the layout and functional design of the device. The regions may be partitioned according to geographic region of the overall die (as in the embodiment of FIG. 2), geographic region of a particular portion of a die, such as a geographic region of a programmable portion of the die (e.g. a programmable logic portion of an application specific integrated circuit (ASIC)), or any portion of a particular type of circuit of a programmable logic device (e.g. a geographic region of the configurable logic blocks (CLBs) of the programmable logic portion, such as a portion of a row of CLBs, as will be described in more detail below).

In some embodiments, regions are not defined by physical locality, but are convenient collections of physical resources that may all be avoided simultaneously by placement and routing software. In other embodiments, regions are defined by the functionality of the defective programmable logic, programmable logic identified by the application of predetermined test vectors, or any other designation of a region that would enable a user to avoid the defective programmable logic in the device.

For example, in some embodiments the regions are determined based on the vectors in a test program. In one embodiment, one region corresponds to a failure of one of the test vectors. In another embodiment, one region corresponds to a failure of any one of a subset of test vectors. In another embodiment, one region corresponds to a failure of multiple, pre-defined test vectors.

As will be described in more detail below, the programmable logic device may be programmed to implement a design according to a layout which avoids the defective region. Although a single defective region is shown by way of example, multiple defective regions may be identified, where the device is programmed to avoid all of the identified defective regions.

Figure 3:
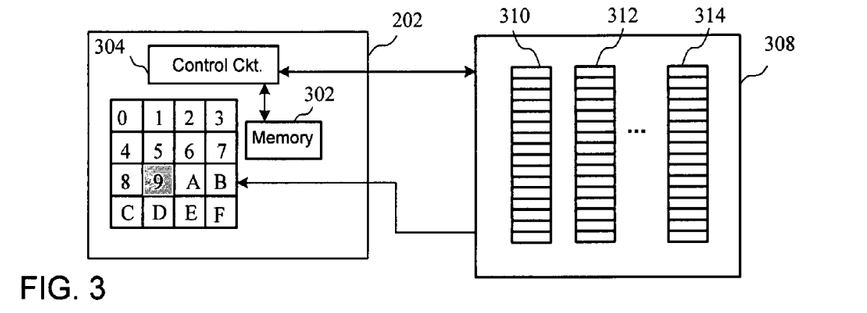
FIG. 3 is a system for enabling the use of a defective programmable logic device according to an embodiment of the present invention.

Turning now to FIG. 3, a system for enabling the use of a defective programmable logic device according to an embodiment of the present invention is shown. In particular, a device 202 having programmable logic comprises a non-volatile memory 302 and a control circuit 304 enabling communication with a programming device 308. The control circuit 304 may comprise a processor, for example, or a logic circuit enabling reading from and writing to the memory 302. The control circuit 304 may also comprise a configuration controller. The memory 302 stores an indication of the location of the defect, which according to the example of FIG. 3 would be an indication that the defective programmable logic is in region 9.

The programming device 308 may be any device which programs the device 202, such as a non-volatile memory. The programming device 308 stores a plurality of configuration bitstreams 310-314 associated with a plurality of implementations of a given design. (In other words, configuration bitstreams 310-314 all implement the same design, but each in a different fashion.) In the pictured embodiment, the configuration bitstreams 310-314 include 16 bitstreams, with one bitstream for each device having defective programmable logic in one of the 16 regions. According to one embodiment, each of the 16 bitstreams is unique and may be used with a device having defective programmable logic in only one pre-determined region of the programmable logic. Accordingly, the programming device 308 stores each of the unique 16 bitstreams which have been placed and routed to avoid one of the regions having defects in the programmable logic. If the device 202 comprises a CPLD, for example, the configuration bitstreams would be stored in a non-volatile memory of the CPLD.

The control circuit 304 receives the indication of the region having defective programmable logic, and provides a selection signal to the programming device 308 to select a given bitstream to be used to program the programmable logic, and in particular, program the programmable logic to avoid the defective region. For example, the control circuit may generate a selection signal based upon an indicator stored in the non-volatile memory 302 indicating that region 9 includes defective programmable logic.

Figure 4:
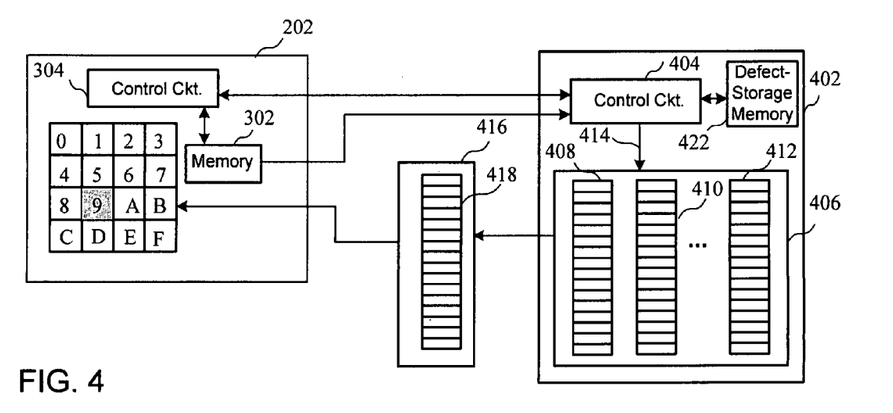
FIG. 4 is a system for enabling the use of a defective programmable logic device according to an alternate embodiment of the present invention.

Turning now to FIG. 4, a system for enabling the use of a defective programmable logic device according to an alternate embodiment of the present invention is shown. In particular, a programming device 402 comprises a control circuit 404 coupled to the device 202 and a memory 406 comprising a plurality of configuration bitstreams 408-412. The control circuit is coupled to select one of the configuration bitstreams by way of a selection signal 414. A non-volatile memory 416 is coupled to receive the selected configuration bitstream 418 which is loaded into the device 202 at startup. Although the non-volatile memory 416 is shown separate from the device 202 in FIG. 4, the non-volatile memory 416 storing the selected configuration bitstream may be on the device 202. While the control circuit 404 may select the correct configuration bitstream based upon the indication of the location of the defect stored in non-volatile memory 302, alternatively or additionally, a defect-storage memory 422 may store identifiers for the bitstream associated with identifiers for the defective programmable logic device to select the correct configuration bitstream. That is, the correct configuration bitstream may be determined from the value in the non-volatile memory 302, or may be determined from an identifier stored in the non-volatile memory of the PLD or otherwise associated with the PLD based upon data in the defect storage memory 422. For example, defect-storage memory 422 may comprise a lookup table which receives the indication of the location of the defect, and provides an indication of the correct configuration bitstream to the control circuit 404.

Figure 5:
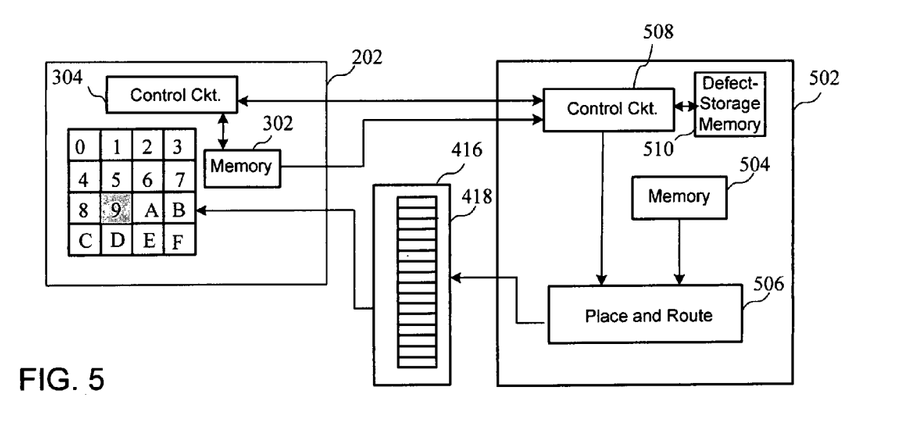
FIG. 5 is a system for enabling the use of a defective programmable logic device according to a further alternate embodiment of the present invention.

Turning now to FIG. 5, a system for enabling the use of a defective programmable logic device according to a further alternate embodiment of the present invention is shown. In particular, the system 502 of FIG. 5 comprises a memory 504 coupled to a place and route tool 506 enabling the placing and routing of a circuit design. The place and route tool may be any conventional software tool implemented in the system 502 for placing and routing a given design. For example, the place and route tool may be ISE Foundation software available from Xilinx, Inc., of San Jose, Calif. The memory 504 stores a circuit design for implementing one or more functions in programmable logic of the programmable logic device, and is coupled to the place and route tool 506. Accordingly, rather than storing 16 bitstreams associated with each of the 16 regions having a defect, the memory 504 stores the circuit design itself implemented in Verilog code, for example, which is placed and routed to avoid the defective region identified in the indication of the defective region provided by the memory 302. The configuration bitstream 418 is then stored in the non-volatile memory 416 which is loaded into the device 202 at startup. Place and route tool 506 may be controlled by control circuit 508, which has access to location data stored in the non-volatile memory 302 and/or defect storage memory 510. That is, the correct configuration bitstream may be generated based upon the value in the non-volatile memory 302, or based upon data in the defect storage memory 510 associated with indication of the location of the defect stored in non-volatile memory 302 or marked on the device as set forth above.

Figure 6:
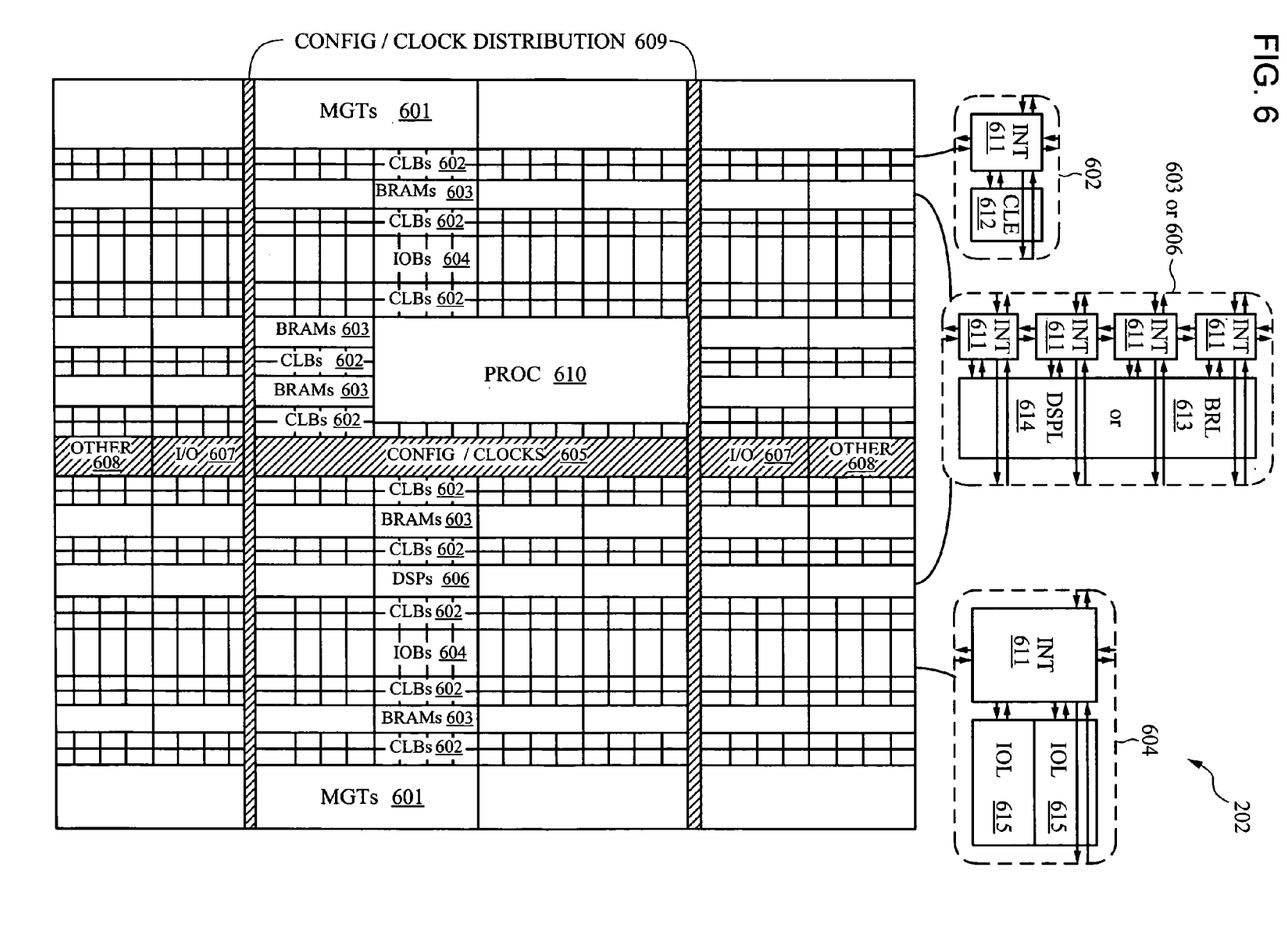
FIG. 6 is a block diagram of a programmable logic device according to an embodiment of the present invention.

Turning now to FIG. 6, a block diagram of a programmable logic device 202 according to an embodiment of the present invention is shown. As noted above, advanced FPGAs may include several different types of programmable logic blocks in the array. For example, FIG. 6 illustrates an FPGA architecture that includes a large number of different programmable tiles comprising programmable logic including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 may include a configurable logic element (CLE 612) that may be programmed to implement user logic plus a single programmable interconnect element (INT 611). A BRAM 603, may include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 606 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611). As will be clear to those of skill in the art, the actual I/O pads connected, for example, to the I/O logic element 615 typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. Defective blocks of the programmable logic device of FIG. 6 may be used to define regions of defective programmable logic, as described above.

Figure 7:
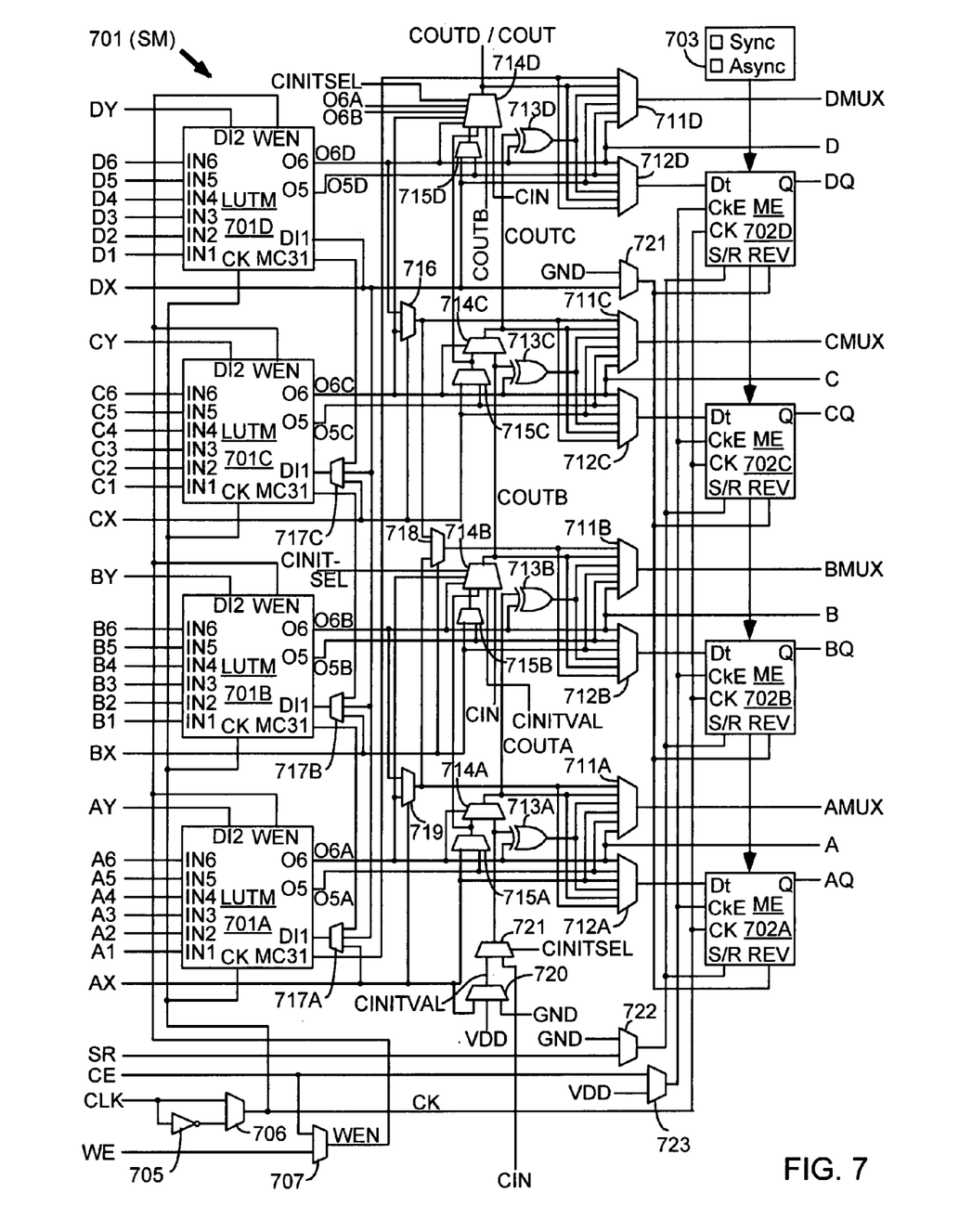
FIG. 7 is a block diagram of a configurable logic element of the programmable logic device of FIG. 6 according to an embodiment of the present invention.

Turning now to FIG. 7, a block diagram of a configurable logic element according to an embodiment of the present invention is shown. In particular, FIG. 7 illustrates in simplified form a configurable logic element 612 of a configuration logic block 602 of FIG. 6. In the embodiment of FIG. 7, slice M (SM) 701 includes four lookup tables (LUTMs) 701A-701D, each driven by six LUT data input terminals A1-A6, B1-B6, C1-C6, and D1-D6 and each providing two LUT output signals O5 and O6. The O6 output terminals from LUTs 701A-701D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 711A-711D driving output terminals AMUX-DMUX; multiplexers 712A-712D driving the data input terminals of memory elements 702A-702D; combinational multiplexers 716, 718, and 719; bounce multiplexer circuits 722-723; a circuit represented by inverter 705 and multiplexer 706 (which together provide an optional inversion on the input clock path); and carry logic comprising multiplexers 714A-714D, 715A-715D, 720-721 and exclusive OR gates 713A-713D. All of these elements are coupled together as shown in FIG. 7. Where select inputs are not shown for the multiplexers illustrated in FIG. 7, the select inputs are controlled by configuration memory cells. That is, configuration bits of the configuration bitstream stored in the configuration memory cells are coupled to the select inputs of the multiplexer to select the correct input to the multiplexer. These configuration memory cells, which are well known, are omitted from FIG. 7 for clarity.

In the pictured embodiment, each memory element 702A-702D may be programmed to function as a synchronous or asynchronous flip-flop or latch. The selection between synchronous and asynchronous functionality is made for all four memory elements in a slice by programming Sync/Asynch selection circuit 503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 702A-702D are clocked by a clock signal CK, which may be provided by a global clock network or by the interconnect structure, for example. Such programmable memory elements are well known in the art of FPGA design. Each memory element 702A-702D provides a registered output signal AQ-DQ to the interconnect structure. Because each LUT 701A-701D provides two output signals, O5 and O6, the LUT may be configured to function as two 5-input LUTs with five shared input signals (IN1-IN5), or as one 6-input LUT having input signals IN1-IN6.

In the embodiment of FIG. 7, each LUTM 701A-701D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in random access memory (RAM) mode, each LUT functions as a single 64-bit RAM or two 32-bit RAMs with shared addressing. The RAM write data is supplied to the 64-bit RAM via input terminal DI1 (via multiplexers 717A-717C for LUTs 701A-701C), or to the two 32-bit RAMs via input terminals DI1 and DI2. RAM write operations in the LUT RAMs are controlled by clock signal CK from multiplexer 706 and by write enable signal WEN from multiplexer 707, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 701A may also be provided to the general interconnect structure for shift register chaining, via output select multiplexer 711D and CLE output terminal DMUX. The devices having programmable logic and the methods of the present invention may be implemented according to the device of FIGS. 6 and 7, or in any device, including any type of integrated circuit having programmable logic.

Figure 8:
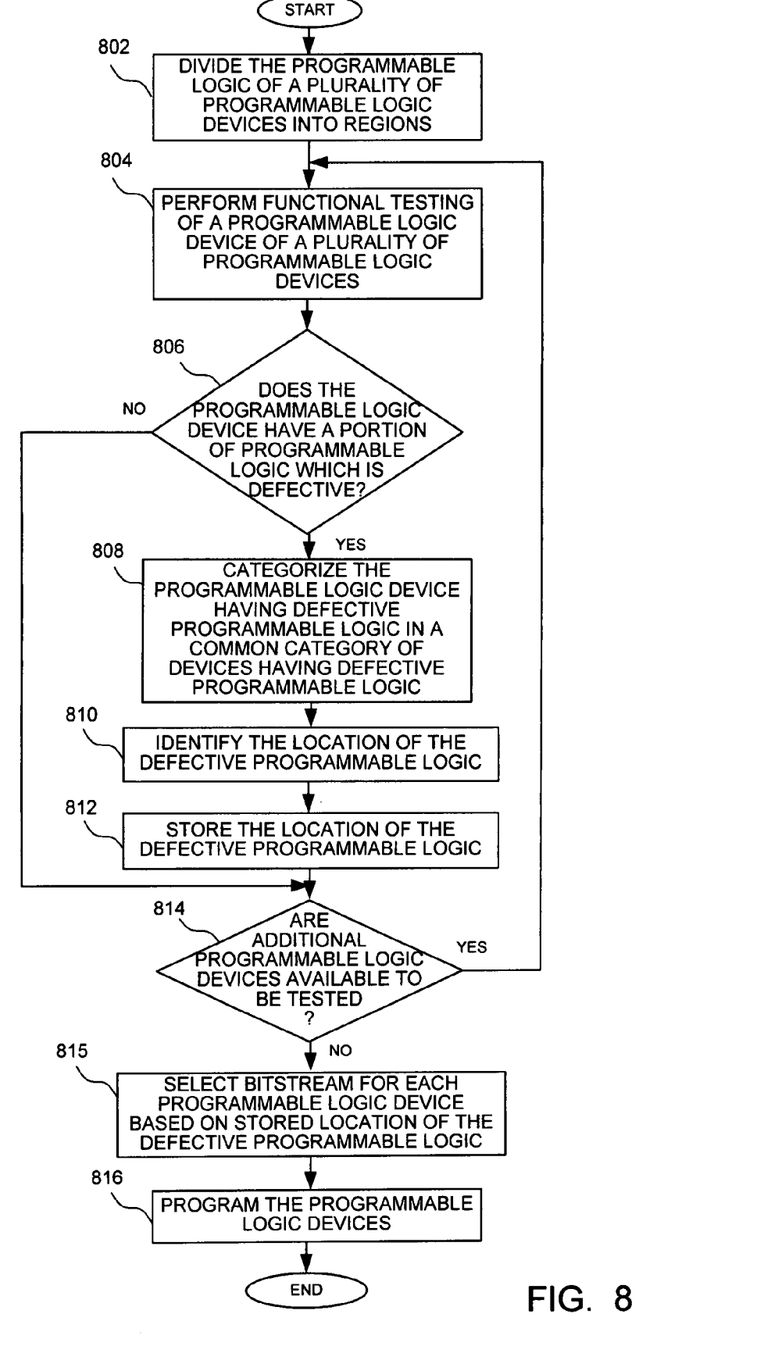
FIG. 8 is a flow chart showing a method of categorizing programmable logic devices determined to be defective according to an embodiment of the present invention.

Turning now to FIG. 8, a flow chart shows a method of categorizing programmable logic devices determined to be defective according to an embodiment of the present invention. In particular, programmable logic of the plurality of programmable logic devices is divided into regions at a step 802. The regions of defective programmable logic may be defined based upon the criteria set forth above. Functional testing of a programmable logic device of a plurality of programmable logic devices is performed at a step 804. It is then determined whether the programmable logic device has a portion of programmable logic which is defective at a step 806. If not, the process continues at step 814, which is described below. If so, the programmable logic devices having defective programmable logic in different regions are categorized in a common category of defective products at a step 808. For example, the devices which are identified as having defective programmable logic are stored in a common bin, even if the devices have defective programmable logic in different regions. The location of the defective programmable logic is identified at a step 810. The location of the defective programmable logic is then stored at a step 812. For example, the location of the defective programmable logic may be stored in a memory of the device, or by some other means such as marking the device as described above. It is then determined whether additional programmable logic devices are available to be tested at a step 814. If so, functional testing of additional programmable logic devices is performed at step 804. Otherwise, a bitstream is selected for each programmable logic device at step 815, based on the stored location of the defective programmable logic in the programmable logic device. Finally, the programmable logic devices are programmed with the selected bitstreams at a step 816, as will be described according to one embodiment of the method of FIG. 9.

Figure 9:
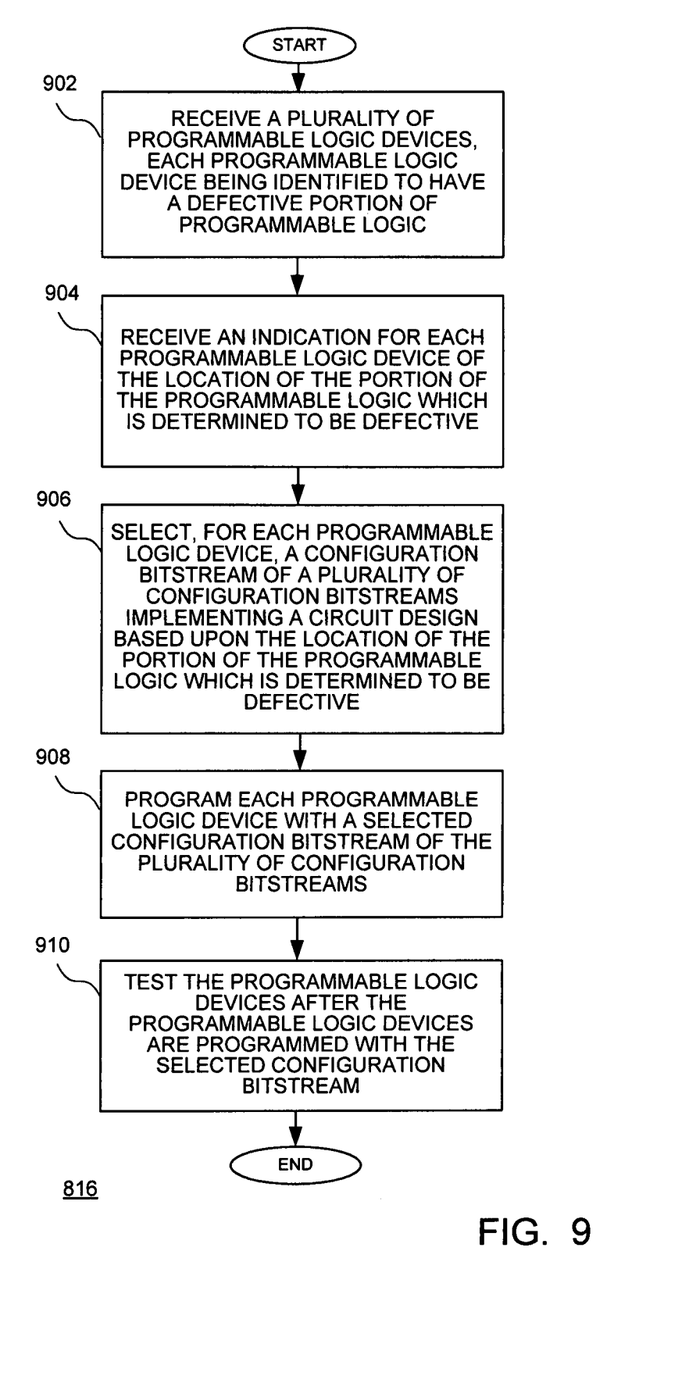
FIG. 9 is a flow chart showing a method of programming a plurality of programmable logic devices according to an embodiment of the present invention.

Turning now to FIG. 9, a flow chart shows a method of programming a plurality of programmable logic devices according to an embodiment of the present invention. A plurality of programmable logic devices are received at a step 902, where each programmable logic device is identified to have a defective portion of programmable logic. An indication for each programmable logic device of the location of the portion of the programmable logic which is determined to be defective is received at a step 904. The indication may be received, for example, by reading a non-volatile memory of the device. A configuration bitstream of a plurality of configuration bitstreams implementing a circuit design is selected, for each programmable logic device, at a step 906, wherein the selection of a configuration bitstream is based upon the location of the portion of the programmable logic which is determined to be defective. Each programmable logic device is then programmed with a selected configuration bitstream of the plurality of configuration bitstreams at a step 908. Finally, the programmable logic devices are tested after being programmed with a selected configuration bitstream at a step 910.

Figure 10:
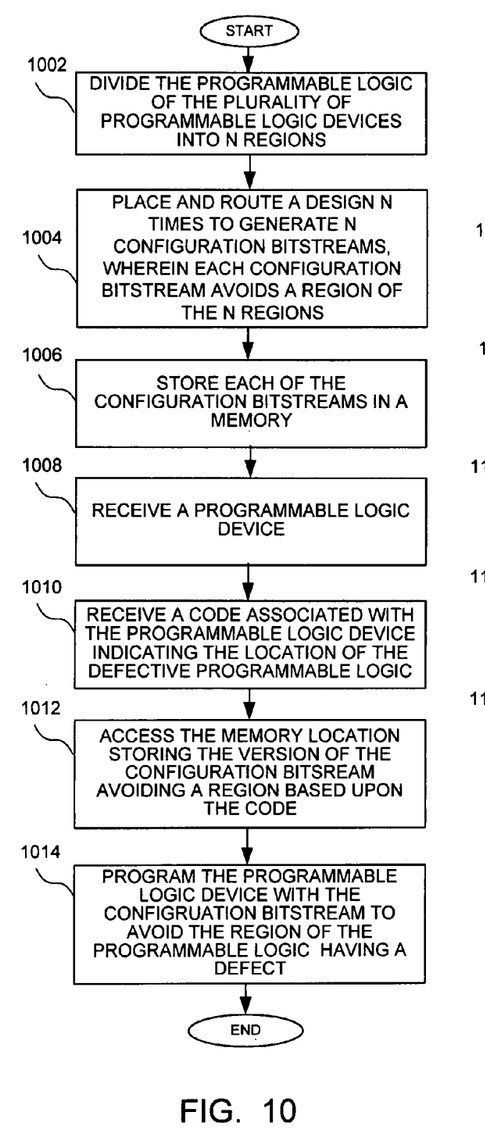
FIG. 10 is a flow chart showing a method of enabling programming a defective programmable logic device based upon a code associated with the programmable logic device according to an embodiment of the present invention.

Turning now to FIG. 10, a flow chart shows a method of enabling programming a defective programmable logic device based upon a code associated with the programmable logic device according to an embodiment of the present invention. The programmable logic of the plurality of programmable logic devices is divided into N regions at a step 1002. The regions may be determined, for example, as described above in connection with FIG. 2. A design is placed and routed N times, generating N configuration bitstreams at a step 1004, wherein each configuration bitstream avoids a region of the N regions. Each of the configuration bitstreams is stored in a memory at a step 1006. A programmable logic device is then received at a step 1008. A code associated with the programmable logic device is received at a step 1010. The memory location storing the version of the configuration bitstream avoiding the defective region based upon the code is accessed at a step 1012. Finally, the programmable logic device is programmed with the configuration bitstream to avoid the region having a defect at a step 1014.

Figure 11:
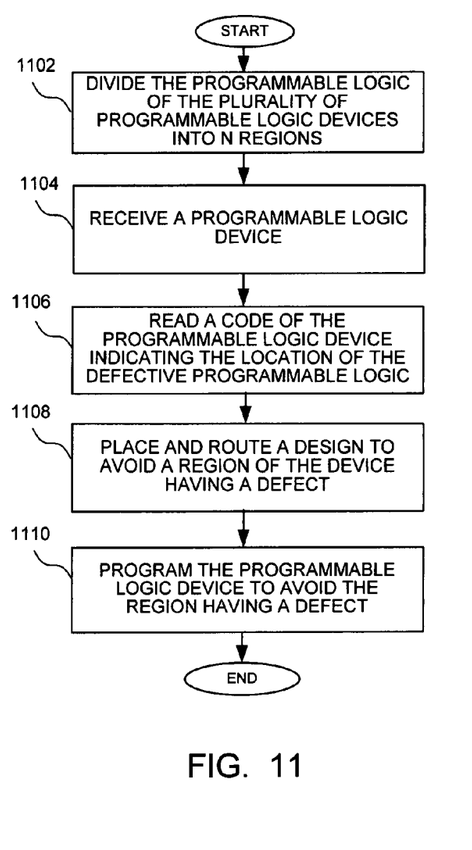
FIG. 11 is a flow chart showing a method of programming a defective programmable logic device according to an embodiment of the present invention.

Turning now to FIG. 11, a flow chart shows a method of programming a defective programmable logic device according to an embodiment of the present invention. The programmable logic of the plurality of programmable logic devices is divided into N regions at a step 1102. A programmable logic device is received at a step 1104. A code associated with the programmable logic device is read at a step 1106. A design that avoids a region of the device having a defect is placed and routed at a step 1108. Finally, the programmable logic device is reprogrammed based upon the step 1108 to avoid the region having a defect at a step 1110.

The methods of FIGS. 8-11 may be implemented using any of the systems and devices of FIGS. 1-7 as described above, for example, or any other suitable system or device.

It will be appreciated that new and novel methods of enabling the use of a defective programmable logic device has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of enabling the use of defective programmable devices, the method comprising:

performing functional testing for each programmable device of a plurality of programmable devices;

identifying each programmable device of the plurality of programmable devices which has a defective portion of programmable blocks;

identifying, for each programmable device which is identified to have a defective portion of programmable blocks, a location of the defective portion of programmable blocks;

storing, for each programmable device which is identified to have a defective portion of programmable blocks, the location of the defective portion of programmable blocks; and selecting a configuration bitstream for one of the programmable devices, wherein the selected configuration bitstream is selected from a plurality of configuration bitstreams based upon the stored location of the defective portion for the one of the programmable devices.

2. The method of claim 1, further comprising dividing the programmable blocks of the plurality of programmable devices into regions.

3. The method of claim 2, wherein identifying the location of the defective portion of programmable blocks comprises designating a region having the defective portion.

4. The method of claim 3, further comprising categorizing programmable devices having defective portions of programmable blocks in different regions in a common category of defective products.

5. The method of claim 1, wherein storing the location of the defective portion of programmable blocks comprises storing the location in a non-volatile memory of the programmable device.

6. The method of claim 1, further comprising, for each programmable device, programming the programmable device with the selected configuration bitstream.

7. The method of claim 6, further comprising testing the programmed programmable devices.

8. A method of enabling the use of defective programmable devices, the method comprising:

receiving a plurality of programmable devices, each programmable device having an indication of a location of a defective portion of programmable blocks;

selecting, for each programmable device, a configuration bitstream of a plurality of configuration bitstreams implementing a same circuit design, wherein the selection of a configuration bitstream is based upon the location of the defective portion of programmable blocks; and programming each programmable device with a corresponding selected configuration bitstream of the plurality of configuration bitstreams.

9. The method of claim 8, further comprising receiving, for each programmable device, the indication of the location of the defective portion of programmable blocks.

10. The method of claim 8, wherein receiving the plurality of programmable devices comprises receiving a plurality of programmable devices each having an indication of the location of the defective portion of programmable blocks which is readable on the device.

11. The method of claim 8, wherein receiving the plurality of programmable devices comprises receiving a plurality of programmable devices each having a non-volatile memory storing the location of the defective portion of programmable blocks.

12. The method of claim 8, wherein selecting the configuration bitstream comprises selecting the configuration bitstream based upon the location of the defective portion of programmable blocks being in a predetermined region of the programmable blocks.

13. The method of claim 12, wherein selecting the configuration bitstream comprises selecting the configuration bitstream associated with the predetermined region.

14. The method of claim 8, further comprising testing, for each programmable device, the programmable device programmed with the corresponding selected configuration bitstream.

15. A device having programmable circuits, the device comprising:

a plurality of programmable circuits, wherein at least a portion of the programmable circuits is defective;

a non-volatile memory storing an indication of a location of the portion of the programmable circuits which is defective; and a plurality of configuration memory elements storing configuration bits of a selected configuration bitstream, wherein the selected configuration bitstream is selected from a plurality of configuration bitstreams based upon the indication stored in the non-volatile memory.

16. The device of claim 15, wherein the plurality of programmable circuits comprises configurable blocks.

17. The device of claim 15, wherein the plurality of programmable circuits comprises blocks of random access memory.

18. The device of claim 15, further comprising an input/output block for outputting the indication of the location of the portion of the programmable circuits which is defective.

19. The device of claim 18, further comprising configuration logic coupled to the non-volatile memory to provide the indication of the location of the portion of the programmable circuits which is defective by way of the input/output block.

20. The device of claim 18, further comprising a configuration controller coupled to the non-volatile memory to provide the indication of the location of the portion of the programmable circuits which is defective by way of the input/output block.

\* \* \* \* \*